United States Patent
Sugiyama et al.

(10) Patent No.: US 7,710,726 B2
(45) Date of Patent: May 4, 2010

(54) ELECTRONIC CIRCUIT APPARATUS FOR COMPRESSOR

(75) Inventors: Junichi Sugiyama, Kanagawa (JP); Shigetomi Tokunaga, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/066,912

(22) PCT Filed: Sep. 7, 2007

(86) PCT No.: PCT/JP2007/067899

§ 371 (c)(1),
(2), (4) Date: Mar. 14, 2008

(87) PCT Pub. No.: WO2008/032811

PCT Pub. Date: Mar. 20, 2008

(65) Prior Publication Data
US 2009/0161320 A1 Jun. 25, 2009

(30) Foreign Application Priority Data
Sep. 13, 2006 (JP) ............... 2006-247734

(51) Int. Cl.
H05K 7/20 (2006.01)
H05K 7/12 (2006.01)
(52) U.S. Cl. ............... 361/704; 361/707; 361/708; 361/715; 361/719; 361/752
(58) Field of Classification Search ............... None
See application file for complete search history.

(56) References Cited

U.S. PATENT DOCUMENTS

| | | | |
|---|---|---|---|
| 3,934,074 A * | 1/1976 | Evelove et al. ............... 174/535 |
| 5,157,587 A * | 10/1992 | Edwards ............... 361/717 |
| 5,285,354 A | 2/1994 | Ohsawa et al. |
| 5,381,304 A | 1/1995 | Theroux et al. |
| 6,365,964 B1 * | 4/2002 | Koors et al. ............... 257/718 |
| 6,373,710 B1 | 4/2002 | Suzuki |
| 2003/0147228 A1 | 8/2003 | Koike et al. |
| 2005/0168957 A1 * | 8/2005 | Kawauchi et al. ............ 361/749 |
| 2006/0044768 A1 | 3/2006 | Mizutani et al. |
| 2006/0077640 A1 * | 4/2006 | Yoshikawa et al. ........... 361/752 |

FOREIGN PATENT DOCUMENTS

JP 11-317570 11/1999

OTHER PUBLICATIONS

International Search Report for International Application No. PCT/JP2007/067899 dated Feb. 8, 2008.

* cited by examiner

*Primary Examiner*—Gregory D Thompson
(74) *Attorney, Agent, or Firm*—RatnerPrestia

(57) ABSTRACT

An electronic circuit apparatus for a compressor includes a board and a case. One corner of the board is fixed to case such that the board cannot move in the thickness direction and is movable in the flattening direction. According to this structure, even when an electronic part generates heat or outside air temperature of the case varies, the expansion or contraction of the board in the flattening direction is not affected by the expansion or contraction of the case in the flattening direction. Therefore, it is possible to prevent the deformation of the board and stress from being repeatedly applied to a soldering portion of the electronic part. As a result, it is possible to ensure the reliability of soldering strength for a long time.

13 Claims, 4 Drawing Sheets

ELECTRONIC CIRCUIT APPARATUS FOR COMPRESSOR

THIS APPLICATION IS A U.S. NATIONAL PHASE APPLICATION OF PCT INTERNATIONAL APPLICATION PCT/JP2007/067899.

TECHNICAL FIELD

The present invention relates to an electronic circuit apparatus for a compressor that includes a circuit board having electronic parts soldered thereto and is used to drive a closed-type motor-driven compressor used for a refrigerating apparatus.

BACKGROUND ART

In an electronic circuit apparatus for a compressor according to the related art, a circuit board having electronic parts soldered thereto is housed in a case, and four corners of the board are fixed to the case by fasteners, such as screws.

Hereinafter, a fixing method according to the related art will be described with reference to the accompanying drawings.

FIG. 4 is an exploded perspective view illustrating an electronic circuit apparatus according to the related art. In FIG. 4, case 10 is formed of synthetic resin, such as nylon or ABS resin, by injection molding, and opening 12 having a size that is slightly larger than that of board 20 is formed in case 10 such that board 20 can be housed in case 10.

A metal pattern (not shown) is formed on or in board 20, and electronic parts (not shown) are soldered to the metal pattern, so that board 20 has an electrical function. In addition, board 20 is provided with connectors 22 for electrically connecting the electronic parts (not shown) to the metal pattern. A portion of case 10 corresponding to connectors 22 is opened, thereby forming cord lead portion 15.

Holes are formed at four corners 25 of board 20 such that board 20 can be fixed to case 10 by board fixing screws 30. Holes are formed at four corners 17 of opening 12 of case 10 such that four corners 45 of lid 40 can be fixed to case 10 by lid fixing screws 50.

The operation of the electronic circuit apparatus for a compressor having the above-mentioned structure will be described below.

In an assembly process of the electronic circuit apparatus for a compressor, first, board 20 is inserted through opening 12 of case 10 such that connectors 22 can be electrically connected to an external apparatus through cord lead portion 15. Then, four corners 25 of board 20 are fixed to case 10 in the thickness direction of board 20 by board fixing screws 30. Finally, four corners 45 of lid 40 are fixed to opening 12 of case 10 by lid fixing screws 50, and board 20 is covered with case 10 and lid 40, thereby completing the assembly process.

This structure is disclosed in Japanese Patent Unexamined Publication No. 11-317570.

However, in the above-mentioned structure, when the electronic circuit apparatus for a compressor is turned on, stress is repeatedly applied to a soldering portion of the electronic part due to the difference between linear expansion coefficients of board 20 and case 10 that is caused by heat generated from the electronic part mounted on board 20 or a variation in the outside air temperature of case 10.

For example, it is assumed that the electronic circuit apparatus for a compressor is used in a temperature range of −50° C. to +90° C. in consideration of the use of the apparatus in the arctic area, the arrangement of the apparatus around the compressor, and heat generated from electronic parts. Therefore, when soldering strength deteriorates due to the stress applied to the soldering portion of the electronic part, soldering cracks may occur in the soldering portion of the electronic part, which results in a defective circuit.

DISCLOSURE OF THE INVENTION

The invention provides an inexpensive electronic circuit apparatus for a compressor capable of ensuring the reliability of the soldering strength of an electronic part for a long time and having high assembly work ability in a wide temperature range, even when the electronic part generates heat or outside air temperature of a case varies.

An electronic circuit apparatus for a compressor according to the invention includes a board and a case, and one corner of the board is fixed to the case such that the board cannot move in the thickness direction, but is movable in the flattening direction. According to this structure, even when an electronic part generates heat or outside air temperature of the case varies, the expansion or contraction of the board in the flattening direction is not affected by the expansion or contraction of the case in the flattening direction, and stress caused by the deformation of the case is not applied to the board. As a result, it is possible to prevent the deformation of the board and fix the board to the case at a predetermined position.

PREFERRED EMBODIMENTS FOR CARRYING OUT THE INVENTION

Hereinafter, preferred embodiments of the invention will be described with reference to the accompanying drawings. However, the invention is not limited to the preferred embodiments.

First Embodiment

Figure 1:
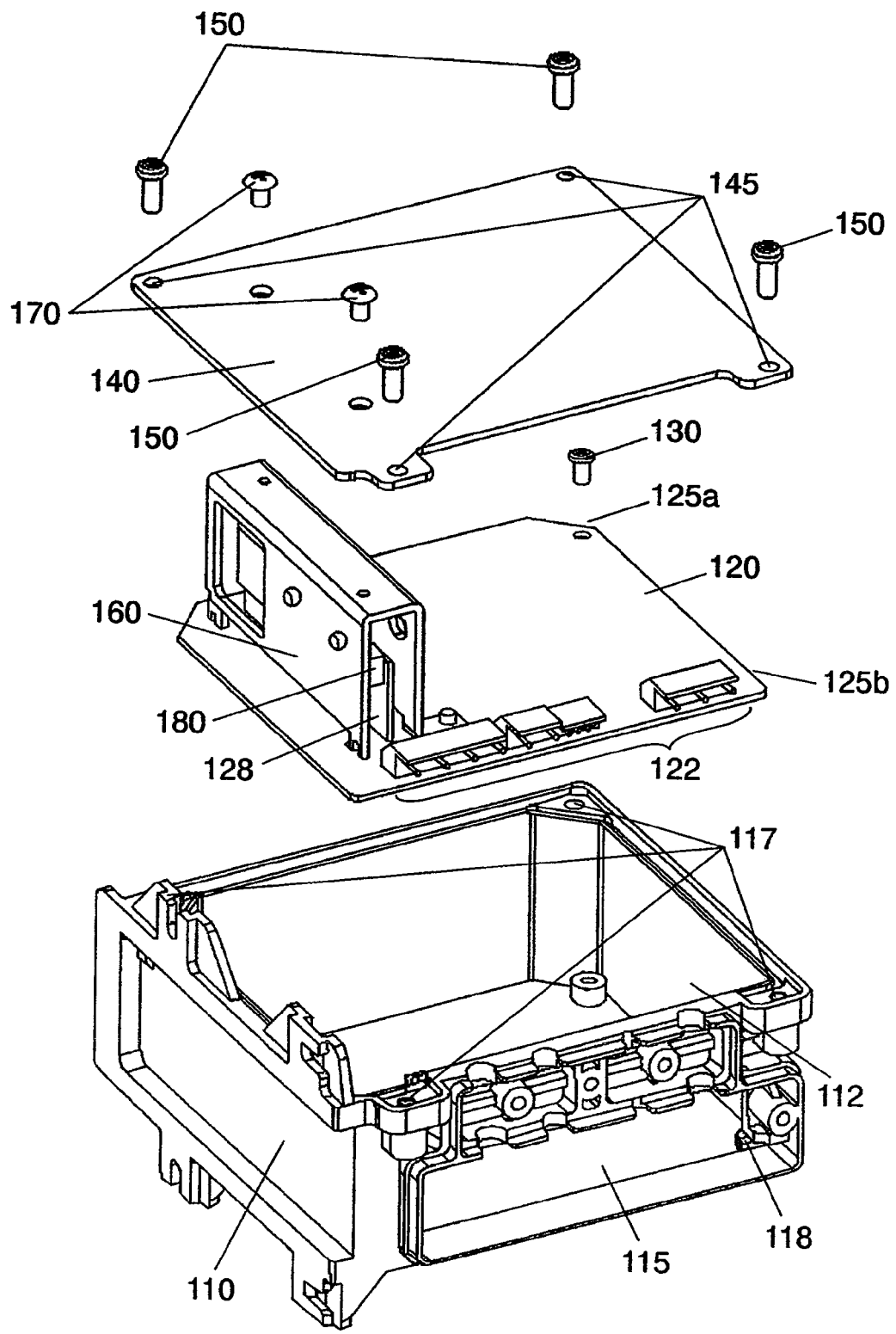
FIG. 1 is an exploded perspective view illustrating an electronic circuit apparatus for a compressor according to a first embodiment of the invention.
Figure 2:
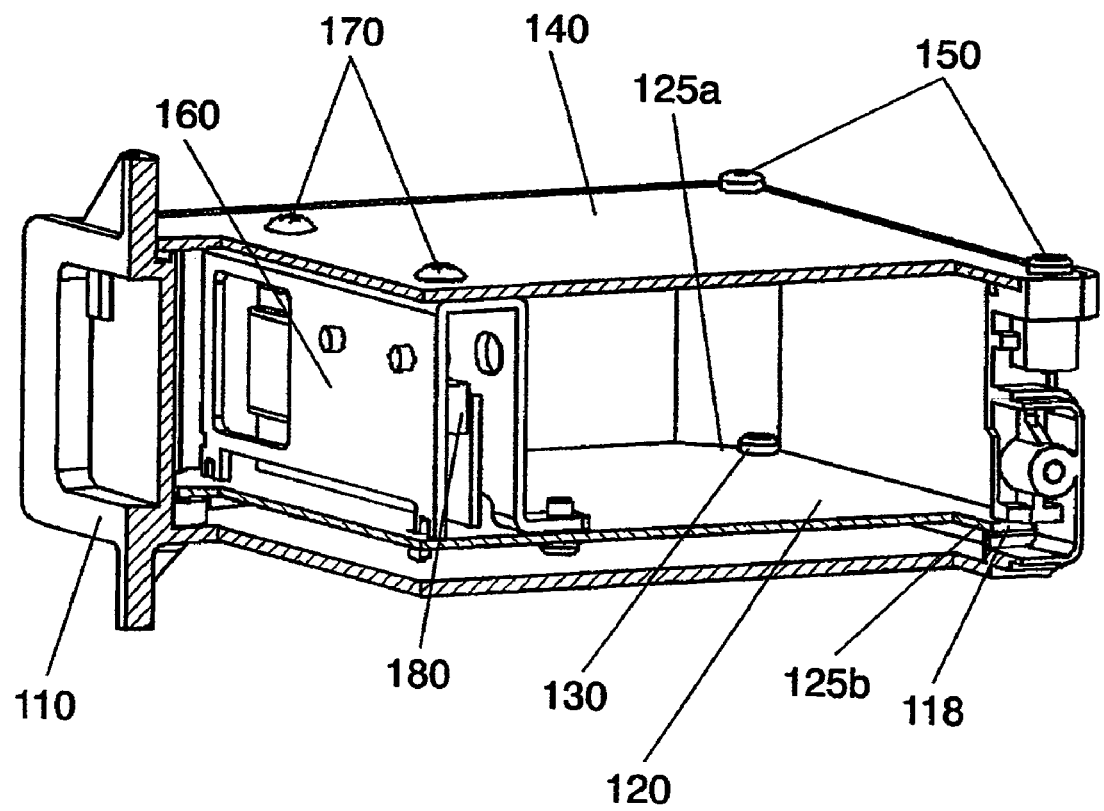
FIG. 2 is a perspective sectional view illustrating the electronic circuit apparatus for a compressor according to the first embodiment of the invention.
Figure 3:
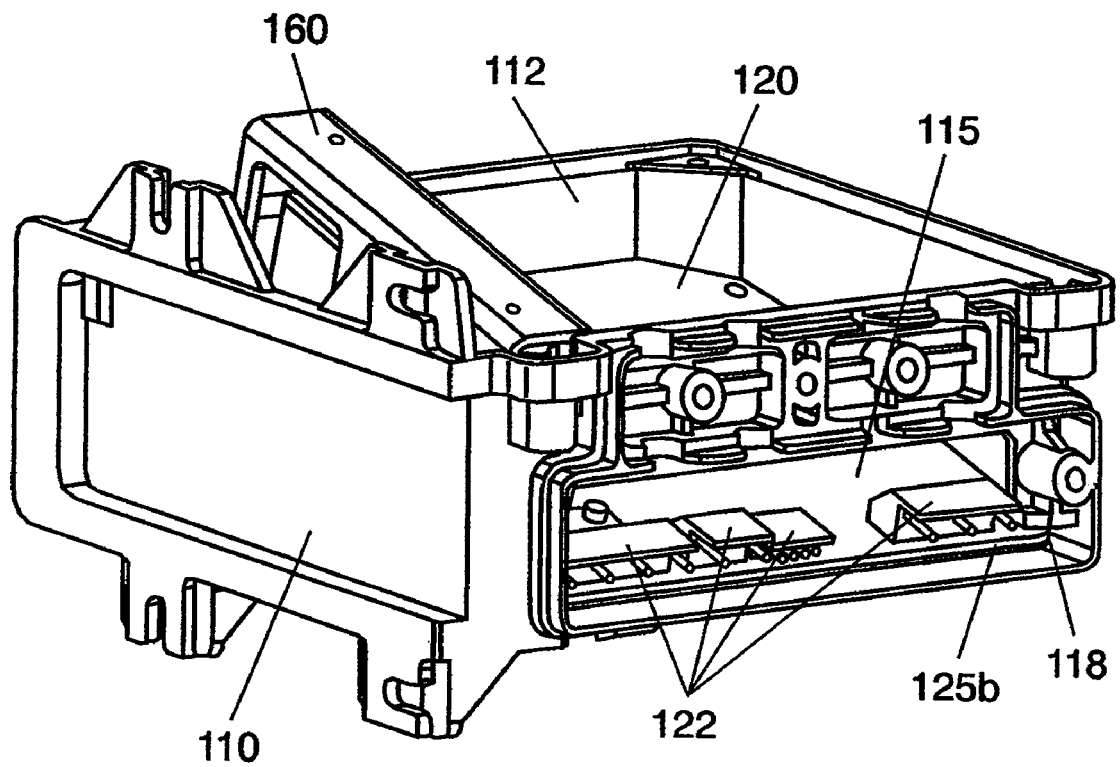
FIG. 3 is an assembled view of the electronic circuit apparatus for a compressor according to the first embodiment of the invention after a board is inserted into a case.
Figure 4:
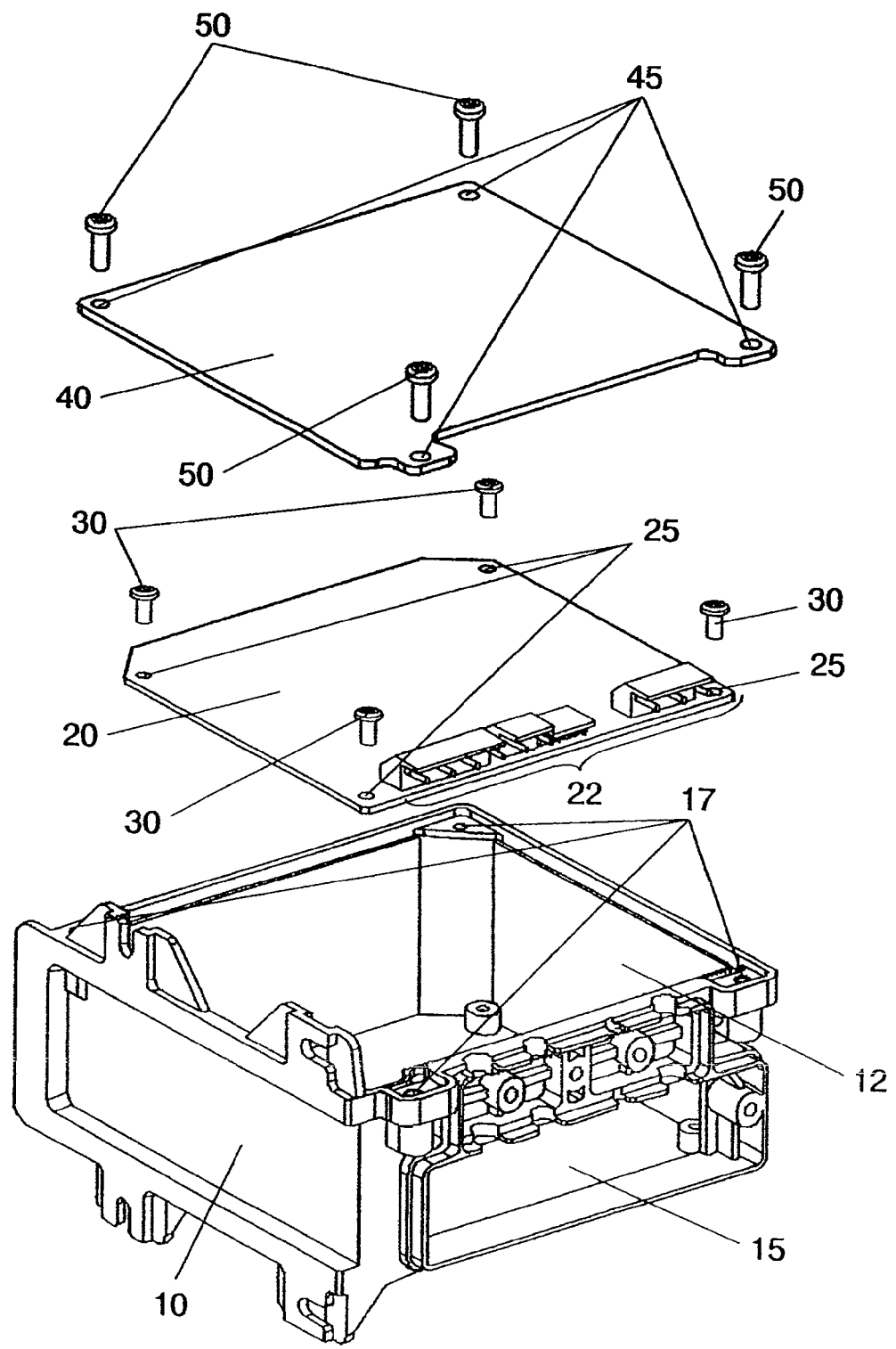
FIG. 4 is an exploded perspective view illustrating an electronic circuit apparatus for a compressor according to the related art.

FIG. 1 is an exploded perspective view illustrating an electronic circuit apparatus for a compressor according to a first embodiment of the invention. FIG. 2 is a perspective sectional view illustrating the electronic circuit apparatus for a compressor according to the first embodiment of the invention. FIG. 3 is an assembled view illustrating the electronic circuit apparatus for a compressor according to the first embodiment of the invention after a board is inserted into a case.

In FIGS. 1 to 3, case 110 is made of modified polyphenylene ether resin by injection molding and has opening 112 having a size that is slightly larger than the size of board 120 such that board 120 can be encased in case 110.

Board 120 is made of glass fabric/glass non-woven fabric epoxy resin, which is a composite. A metal pattern (not shown) is formed on the surface of board 120 or in board 120, and electronic parts (not shown) are connected to the metal pattern by soldering. In this way, board 120 has an electrical function. In addition, board 120 includes connectors 122 that are electrically connected to electronic parts (not shown) by the metal pattern. A portion of case 110 facing the connectors 122 is opened, and the opened portion serves as cord lead portion 115.

A hole is formed at corner 125a of board 120 such that board 120 can be fixed to case 110 by board fixing screw 130. In addition, case 110 has clamping portion 118 that has a width slightly larger than the thickness of board 120 at a position corresponding to corner 125b adjacent to corner 125a.

U-shaped connecting body 160 formed by pressing an aluminum alloy is fixed to board 120 by a screw or caulking (now shown). Electronic part 180 that generates a large amount of heat, such as a power module or a bridge diode, is fixed to the inner wall of U-shaped connecting body 160 by soldering. In addition, second board 128 electrically connected to board 120 is fixed thereto by a screw or an adhesive (not shown).

Lid 140 that is formed by pressing an aluminum alloy is fixed to four corners 117 of opening 112 of the case 110 by lid fixing screws 150 to lid fixing holes 145. Connecting body 160 is fixed to lid 140 by screw 170.

The operation and effect of the electronic circuit Apparatus for a compressor having the above-mentioned structure will be described below.

The electronic circuit apparatus for a compressor is assembled as follows.

First, board 120 having connecting body 160 fixed thereto, connecting body 160 having second board 128 fixed to the inner wall thereof, is disposed such that connector 122 faces cord lead portion 115 of case 110. Then, board 120 is inserted into case 110 through opening 112 so as to be electrically connected to an external apparatus.

At that time, board 120 is obliquely inserted into case 110 through opening 112, with connectors 122 that are mounted on board 120 being inclined downward, such that corner 125b of board 120 is loosely fitted to clamping portion 118. Then, board 120 is arranged at a predetermined position so as to be parallel to case 110. Subsequently, one corner 125a of board 120 is fixed to case 110 by board fixing screw 130 in the thickness direction of the board 120.

Finally, lid fixing screws 150 are engaged with four lid fixing holes 145 of lid 140 to fix lid 140 to four corners 117 of opening 112 of case 110. In addition, board 120 is covered with case 110 and lid 140. Then, connecting body 160 is fixed to lid 140 by screws 170, thereby completely assembling the electronic circuit apparatus for a compressor.

In an electronic circuit apparatus for a compressor according to the related art, the causes of a soldering crack occurring in a soldering portion of an electronic component are examined.

As the result of the examination, the soldering crack is caused by a method of fixing board 20 to case 10 and the difference between linear expansion coefficients of materials forming board 20 and case 10. That is, first, the soldering crack is caused by a method of fixing four corners 25 of board 20 to case 10 by board fixing screws 30 in the thickness direction of board 20. In addition, second, the soldering crack is caused by the difference between the linear expansion coefficients of board 20 and case 10. In general, base 20 is made of a glass fabric base material epoxy resin having a linear expansion coefficient of $1.4 \times 10^{-5}/°$ C. However, case 10 is generally made of nylon having a linear expansion coefficient of $8.2 \times 10^{-5}/°$ C. or an ABS resin having a linear expansion coefficient of $6.5 \times 10^{-5}/°$ C. to $9.5 \times 10^{-5}/°$ C.

When outside air temperature varies, the two causes make it difficult for the thermal expansion or contraction of board 20 to follow the thermal expansion or contraction of case 10, and stress is applied in a direction in which board fixing screws 30 tightened to four corners 25 tear board 20 or in a direction in which case 10 is contracted. As a result, deformation due to the stress repeatedly occurs in the soldering portion of an electronic part, which results in the deterioration of soldering strength.

Specifically, assuming that case 10 is made of a material having a linear expansion coefficient of $7.0 \times 10^{-5}/°$ C. and board 20 is made of a material having a linear expansion coefficient of $1.4 \times 10^{-5}/°$ C. and the electronic circuit apparatus for a compressor is used in a temperature range of $-50°$ C. to $+90°$ C. in consideration of the use of the apparatus in the arctic area, the arrangement of the apparatus around the compressor, and heat generated from electronic parts, the maximum temperature difference between the assembled temperature and the used temperature is ±70K. A rectangular board having a side whose length is 120 mm, which is a general size of the electronic circuit apparatus for a compressor, is expanded or contracted by ±0.12 mm in the flattening direction. Case 10 having the same size as board 20 is expanded or contracted by ±0.59 mm in the flattening direction. The expanded or contracted length of case 10 is larger than that of board 20 by 0.47 mm, which is a maximum value.

When board 20 is fixed to case 10 in the flattening direction, the soldering portion of an electronic part is repeatedly deformed due to stress caused by a variation in the temperature, and the soldering strength deteriorates, which results in soldering cracks.

In order to solve the problem of the soldering cracks, in the first embodiment of the invention, board 120 is fixed to case 110 in the thickness direction and the flattening direction by tightening board fixing screw 130 to only one corner 125a, and corners other than corner 125a are not fixed to case 110 in the flattening direction such that they are movable. Here, the flattening direction is a direction parallel to a major surface (the surface on which the metal pattern is formed) of the board 120, i.e., a direction perpendicular to the thickness direction of the board 120.

In this way, even when an electronic part generates heat, or the outside air temperature of case 110 varies, the expansion or contraction of board 120 in the flattening direction is not affected by the expansion or contraction of case 110 in the flattening direction, but depends on only the linear expansion coefficient of board 120. Therefore, even when an electronic part generates heat, or the outside air temperature of case 110 varies, the expansion or contraction of case 110 does not affect the deformation of board 120. As a result, even when board 120 and case 110 are made of materials having different linear expansion coefficients, it is possible to prevent stress from being repeatedly applied to the soldering portion of an electronic part, and thus ensure the reliability of soldering strength for a long time.

According to this embodiment, at least one corner of board 120 can be reliably fixed to case 110 by board fixing screw 130. Therefore, even when vibration is applied to the electronic circuit apparatus for a compressor from the outside, it is possible to prevent board 120 from deviating from or being detached from case 110.

Further, board 120 can be fixed to the inside of case 110 at a predetermined position by board fixing screw 130. Therefore, after board 120 is fixed to case 110, a power cord (not shown) and a communication cord (not shown) connected to board 120, and electronic parts mounted on another board 120 are arranged at predetermined positions. As a result, it is possible to improve assembly workability.

In this embodiment, board 120 is made of glass fabric/glass non-woven fabric epoxy resin, which is a composite. This material has a larger amount of glass non-woven fabric, higher punching processability, and higher drill processability, and is inexpensive, as compared to a glass fabric base material epoxy resin forming a board that is generally used for a personal computer or a precise electronic apparatus. In addition, modified polyphenylene ether forming case 110 is a self-extinguishing material, and is thermally deformed at a temperature of 120° C. or more. Therefore, the material forming case 110 has little thermal deformation in a temperature range of −50° C. to +90° C., and is inexpensive.

Further, opening 112 provided in case 110 is covered with lid 140 formed of an aluminum material having high thermal conductivity, which makes it possible to effectively dissipate heat generated from electronic parts through lid 140 using the air in the electronic circuit apparatus and thus prevent an increase in the temperature of the electronic parts.

Furthermore, lid 140 and board 120 are thermally connected to each other by connecting body 160 formed of an aluminum material having high thermal conductivity, which makes it possible to effectively transmit heat generated from electronic parts from board 120 to lid 140 through connecting body 160 having high thermal conductivity and thus dissipate heat from lid 140. As a result, it is possible to effectively dissipate heat generated from the electronic parts and thus prevent an increase in the temperature of the electronic parts.

Moreover, since lid 140 and connecting body 160 are made of aluminum, board 120 made of glass fabric/glass non-woven fabric epoxy resin, lid 140, and connecting body 160 have a similar linear expansion coefficient of $2.4 \times 10^{-5}/°$ C. to $2.5 \times 10^{-5}/°$ C. Therefore, even when thermal expansion or contraction occurs in lid 140 and connecting body 160, with board 120, lid 140, and connecting body 160 being mechanically connected to one another, board 120 is not deformed. Thus, it is possible to prevent stress from being applied to electronic parts and soldering portions of the electronic parts while ensuring heat dissipation from lid 140. In addition, since board 120 is fixed at a plurality of points, it is possible to prevent board 120 from rattling.

Further, in the first embodiment of the invention, corner 125b of board 120 is loosely fitted into clamping portion 118 to reduce the rattling of board 120 in the thickness direction. Therefore, even when force, such as vibration, is applied from outside to the electronic circuit apparatus for a compressor according to the invention, it is possible to prevent exciting force caused by the vibration from being applied to electronic parts and soldering portions of the electronic parts, and thus ensure the reliability of an electronic circuit and soldering strength for a long time.

Meanwhile, connecting body 160 is formed by bending an aluminum plate in a U shape. Since second board 128 having electronic part 180, which generates a large amount of heat, mounted thereon can be provided inside a bent portion of connecting body 160, it is possible to reduce the size of board 120 by a dimension corresponding to the size of second board 128.

Further, it is possible to directly transmit heat generated from electronic part 180 to connecting body 160 and lid 140 to dissipate the heat, which makes it possible to prevent an increase in the temperature of electronic part 180 generating a large amount of heat.

Furthermore, since second board 128 is provided inside the bent portion of connecting body 160, connecting body 160 can protect second board 128 from external impact.

INDUSTRIAL APPLICABILITY

According to the electronic circuit apparatus for a compressor of the invention, even when an electronic part generates heat or outside air temperature of a case varies, it is possible to prevent the board from being deformed and fix the board to the case at a predetermined position. Therefore, the electronic circuit apparatus for a compressor can be used in a high temperature environment in addition to a compressor.

The invention claimed is:

1. An electronic circuit apparatus for a compressor comprising:
    a board that has electronic parts bonded thereto by soldering;
    a case that is formed of a material having a linear expansion coefficient that is different from that of a material forming the board and houses the board, the case being provided with an opening;
    a lid closing the opening; and
    an U-shaped connecting body thermally connecting the lid and the board, the connecting body being provided with an electronic part inside thereof;
    wherein one corner of the board is fixed to the case such that the board cannot move in a thickness direction, but is movable in a flattening direction.

2. The electronic circuit apparatus for a compressor of claim 1,
    wherein the one corner of the board is fixed to the case by a screw in the flattening direction.

3. The electronic circuit apparatus for a compressor of claim 1,
    wherein the board is made of a glass fabric/glass non-woven fabric epoxy resin, which is a composite, and the case is made of modified polyphenylene ether.

4. The electronic circuit apparatus for a compressor of claim 1
    wherein
    the lid is made of a material having high thermal conductivity.

5. The electronic circuit apparatus for a compressor of claim 4 wherein the
    connecting body is made of a material having high thermal conductivity.

6. The electronic circuit apparatus for a compressor of claim 4,
    wherein the material having high thermal conductivity is aluminum.

7. The electronic circuit apparatus for a compressor of claim 5,
    wherein the material having high thermal conductivity is aluminum.

8. The electronic circuit apparatus for a compressor of claim 5,
    wherein the connecting body is formed of an aluminum plate.

9. The electronic circuit apparatus for a compressor of claim 6,
    wherein the connecting body is formed of an aluminum plate.

10. The electronic circuit apparatus for a compressor of claim 7,
    wherein the connecting body is formed of an aluminum plate.

11. The electronic circuit apparatus for a compressor of claim 5 wherein the electronic part is an electronic part generating a large amount of heat.

12. The electronic circuit apparatus for a compressor of claim 6 wherein the electronic part is an electronic part generating a large amount of heat.

13. The electronic circuit apparatus for a compressor of claim 7 wherein the electronic part is an electronic part generating a large amount of heat.

* * * * *